(12) United States Patent
Shibuya et al.

(10) Patent No.: US 9,682,863 B2
(45) Date of Patent: Jun. 20, 2017

(54) METHOD FOR PRODUCING ALIGNED CARBON NANOTUBE ASSEMBLY

(71) Applicants: ZEON CORPORATION, Tokyo (JP); National Institute of Advanced Industrial Science and Technology, Tokyo (JP)

(72) Inventors: Akiyoshi Shibuya, Tokyo (JP); Kenji Hata, Tsukuba (JP); Motoo Yumura, Tsukuba (JP)

(73) Assignees: ZEON CORPORATION, Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/949,697

(22) Filed: Nov. 23, 2015

(65) Prior Publication Data
US 2016/0075558 A1   Mar. 17, 2016

Related U.S. Application Data

(62) Division of application No. 13/381,034, filed as application No. PCT/JP2010/061042 on Jun. 29, 2010, now Pat. No. 9,227,171.

(30) Foreign Application Priority Data

Jul. 1, 2009 (JP) ................................. 2009-157226

(51) Int. Cl.
C01B 31/02 (2006.01)
C23C 16/02 (2006.01)
(Continued)

(52) U.S. Cl.
CPC ........... *C01B 31/024* (2013.01); *B01J 15/005* (2013.01); *B01J 19/0006* (2013.01);
(Continued)

(58) Field of Classification Search
CPC .. B01J 15/005; B01J 19/0006; B01J 19/0073; B01J 19/22; B01J 2219/00159; C01B 31/024; B82Y 30/00; B82Y 40/00
(Continued)

(56) References Cited

U.S. PATENT DOCUMENTS 7,160,531 B1 * 1/2007 Jacques .................. B82Y 30/00
                                                      423/447.1
8,092,754 B2    1/2012 Park
(Continued)

FOREIGN PATENT DOCUMENTS

JP     10-226824 A     8/1998
JP     2003-171108 A   6/2003
(Continued)

OTHER PUBLICATIONS

European Office Action, dated May 25, 2016, for corresponding European Application No. 10 794 138.7.
(Continued)

*Primary Examiner* — Daniel C McCracken
(74) *Attorney, Agent, or Firm* — Birch, Stewart, Kolasch & Birch, LLP

(57) ABSTRACT

Provided is a production apparatus (100) for continuously producing aligned carbon nanotube aggregates on a substrate supporting a catalyst while continuously transferring the substrate. The production apparatus (100) includes gas mixing prevention means (12, 13) for preventing gas present outside a growth furnace (3a) from flowing into the growth furnace (3a). The gas mixing prevention means (12, 13) includes a seal gas ejection section (12b, 13b) so that the seal
(Continued)

gas does not flow into the growth furnace through the openings of the growth furnace. The production apparatus prevents the outside air from flowing into the production apparatus, uniformly controls, within a range suitable to production of CNTs, a concentration distribution(s) and a flow rate distribution(s) of a raw material gas and/or a catalyst activation material on the substrate, and does not disturb gas flow as much as possible in the growth furnace.

8 Claims, 2 Drawing Sheets

(51) Int. Cl.
  *C23C 16/455* (2006.01)
  *C23C 16/26* (2006.01)
  *C23C 16/44* (2006.01)
  *B01J 15/00* (2006.01)
  *B01J 19/00* (2006.01)
  *B01J 19/22* (2006.01)
  *B82Y 30/00* (2011.01)
  *B82Y 40/00* (2011.01)

(52) U.S. Cl.
  CPC ........... *B01J 19/0073* (2013.01); *B01J 19/22* (2013.01); *B82Y 30/00* (2013.01); *B82Y 40/00* (2013.01); *C23C 16/0218* (2013.01); *C23C 16/26* (2013.01); *C23C 16/4408* (2013.01); *C23C 16/4412* (2013.01); *C23C 16/45502* (2013.01); *B01J 2219/00159* (2013.01); *C01B 2202/08* (2013.01); *Y02P 20/149* (2015.11)

(58) Field of Classification Search
  USPC ........ 423/447.1–447.3, 445 B; 977/742–754, 977/842–848
  See application file for complete search history.

(56) References Cited

U.S. PATENT DOCUMENTS

| | | | | |
|---|---|---|---|---|
| 2007/0092431 | A1* | 4/2007 | Resasco | ................. B01J 23/882 423/447.3 |
| 2012/0251432 | A1 | 10/2012 | Cooper et al. | |

FOREIGN PATENT DOCUMENTS

| | | | |
|---|---|---|---|
| JP | 2001-220674 | A | 8/2003 |
| JP | 2003-238125 | A | 8/2003 |
| JP | 2003-252613 | A | 9/2003 |
| JP | 2004-332093 | A | 11/2004 |
| JP | 2006-117527 | | 5/2006 |
| JP | 2007-91556 | A | 4/2007 |
| JP | 2007-92152 | A | 4/2007 |
| JP | 2008-63196 | A | 3/2008 |
| JP | 2008-128619 | A | 6/2008 |
| JP | 2008-531456 | A | 8/2008 |
| WO | WO 2008/153609 | A1 | 12/2008 |

OTHER PUBLICATIONS

Hata et al., "Water-Assisted Highly Efficient Synthesis of Impurity-Free Single-Walled Carbon Nanotubes", Science, vol. 306, Nov. 19, 2004.

International Search Report, dated Aug. 10, 2010, issued in PCT/JP2010/061042.

Final Office Action for copending U.S. Appl. No. 13/381,034, dated Dec. 12, 2014.

Non-Final Office Action for copending U.S. Appl. No. 13/381,034, dated Jun. 3, 2014.

Non-Final Office Action for copending U.S. Appl. No. 13/381,034, dated Mar. 27, 2015.

* cited by examiner

METHOD FOR PRODUCING ALIGNED CARBON NANOTUBE ASSEMBLY

This application is a Divisional of copending application Ser. No. 13/381,034, filed on Dec. 27, 2011, which was filed as PCT International Application No. PCT/JP2010/061042 on Jun. 29, 2010, which claims the benefit under 35 U.S.C. §119(a) to Patent Application No. 2009-157226, filed in Japan on Jul. 1, 2009, all of which are hereby expressly incorporated by reference into the present application.

TECHNICAL FIELD

The present invention relates to an apparatus for producing aligned carbon nanotube aggregates on a substrate supporting a catalyst, which substrate is being continuously transferred.

BACKGROUND ART

Carbon nanotubes (hereinafter referred to also as "CNTs") are carbon structures each structured such that a carbon sheet composed of carbon atoms arranged hexagonally on its plane is looped into a cylindrical shape. The CNTs are classified into single-walled CNTs and multiwall CNTs. Regardless of whether being single-walled or multiwall, the CNTs are expected to be applicable to functional materials such as electronic device materials, optical element materials, and conducting materials because of their mechanical strength, optical properties, electrical properties, thermal properties, and molecular-adsorbing functions, etc.

Among the CNTs, the single-walled CNTs are excellent in various properties such as electrical properties (extremely high in current density), heat properties (comparable in specific thermal conductivity to diamonds), optical properties (emit light in an optical communication band of wavelengths), hydrogen storage capability, and metal catalyst supporting capability. Moreover, the single-walled CNTs exhibit the properties of both semiconductors and metals, and therefore have drawn attention as materials for nano-electronics devices, nanooptical elements, energy storage bodies and the like.

In the case of making efficient use of the CNTs for these purposes, it is desirable that a plurality of CNTs be aligned along a particular direction to form an aggregate in the form of a bundle, a film, or a mass, and that the CNT aggregate exhibit functionalities such as electric/electronic functionalities and optical functionalities. Further, it is preferable that the CNT aggregate be larger in height (length). It is predicted that creation of such an aligned CNT aggregate will lead to a dramatic expansion in the field of application of the CNTs.

A known method for producing such CNTs is a chemical vapor deposition method (hereinafter referred to also as "CVD method") (e.g., see Patent Literature 1). This method is characterized in bringing a carbon-containing gas (hereinafter referred to as "raw material gas") into contact with a catalyst in a form of fine metal particles in a high-temperature atmosphere of approximately 500° C. to 1000° C., and as such, makes it possible to produce the CNTs with variations in aspects such as the kind and arrangement of the catalyst or the kind and condition of reaction of a carbon compound. The CVD method is, therefore highly expected as being suitable to mass production of the CNTs. Further, the CVD method has the advantages of: being capable of producing both single-walled carbon nanotubes (SWCNTs) and multiwall carbon nanotubes (MWCNTs); and being capable of, by use of a substrate supporting a catalyst, producing a large number of CNTs aligned perpendicularly to a surface of the substrate.

The CVD method includes a CNT synthesis step. This CNT synthesis step may be divided into a formation step and a growing step, in which case a metal catalyst supported by a substrate is reduced by being exposed to a hot hydrogen gas (hereinafter referred to as "reducing gas") in the formation step, and then in the growing step the CNTs are synthesized by bringing the catalyst into contact with a raw material gas containing a catalyst activation material.

In the case of a normal CVD method, fine catalyst particles are covered with carbonaceous impurities generated in the process of synthesis of the CNTs; therefore, the catalyst is easily deactivated, and the CNTs cannot grow efficiently. For this reason, it is common to synthesize the CNTs in an atmosphere of low-carbon concentration with the volume fraction of a raw material gas kept to approximately 0.1% to 1% during the CVD. Since the amount of the raw material gas supplied is proportional to the production quantity of the CNTs, the synthesis of the CNTs in an atmosphere of as high-carbon concentration as possible is directly linked to improvement in production efficiency.

In recent years, there has been proposed a technique for the CVD method that remarkably increases an activity and a life of a catalyst by bringing a catalyst activation material such as water, as well as a raw material gas, into contact with the catalyst (such a technique being hereinafter referred to as "super-growth method"; see Non-Patent Literature 1). A catalyst activation material is believed to have an effect of cleansing the outer layer of a catalyst by removing carbonaceous impurities covering fine catalyst particles, and such an effect is believed to remarkably increase the activity and the life of the catalyst. Actually, there has been a case of success in remarkably improving efficiency in production of the CNTs by preventing deactivation of the catalyst even in such an environment of high-carbon concentration (approximately 2% to 20% of the volume fraction of the raw material gas during the CVD) that the catalyst would normally be deactivated. CNTs that are synthesized by applying the super-growth method to a substrate supporting a catalyst have the features of: being large in specific surface area, forming an aggregate of CNTs each aligned along a regular direction; and being low in bulk density (such an aggregate being hereinafter referred to as "aligned CNT aggregate").

Conventionally, CNT aggregates are very high in aspect ratio and one-dimensional elongated flexible substances, and because of their strong van der Waals' force, are likely to constitute random and non-aligned aggregates that are small in specific surface area. Because it is extremely difficult to restructure the orientation of an aggregate that is once random and non-aligned, it has been difficult to produce a CNT aggregate that is large in specific surface area with moldability and processability. However, the super-growth method has made it possible to produce aligned CNT aggregates that are large in specific surface area, have orientation, and can be molded and processed into various forms and shapes, and such aligned CNT aggregates are believed to be applicable as substance/energy storage materials for various uses such as super-capacitor electrodes and directional heat-transfer/heat-dissipation materials.

Conventionally, there have been proposed various production apparatuses for carrying out serial production of the CNTs by the CVD method, a known example thereof being an apparatus for continuously producing CNTs by means of a continuous transferring method or a continuous batch processing system by use of transferring means such as a belt conveyor or a turntable (see Patent Literatures 2 to 6). However, it was found that in the case of serial production of aligned CNT aggregates with use of the super-growth method, there are technical problems specific to high-carbon environment, using a catalyst activation material and/or the like, although there were no such problems with the conventional synthetic method.

CITATION LIST

Patent Literatures

[Patent Literature 1]
Japanese Patent Application Publication, Tokukai, No. 2003-171108 A (Publication Date: Jun. 17, 2003)
[Patent Literature 2]
Japanese Patent Application Publication, Tokukai, No. 2004-332093 A (Publication Date: Nov. 25, 2004)
[Patent Literature 3]
Japanese Patent Application Publication, Tokukai, No. 2006-117527 A (Publication Date: May 11, 2006)
[Patent Literature 4]
Japanese Patent Application Publication, Tokukai, No. 2007-91556 A (Publication Date: Apr. 12, 2007)
[Patent Literature 5]
Japanese Patent Application Publication, Tokukai, No. 2007-92152 A (Publication Date: Apr. 12, 2007)
[Patent Literature 6]
Japanese Patent Application Publication, Tokukai, No. 2008-63196 A (Publication Date: Mar. 21, 2008)

Non-Patent Literatures

[Non-Patent Literature 1] HATA, K. et al.: "Water-Assisted Highly Efficient Synthesis of Impurity-Free Single-Walled Carbon Nanotubes", *Science*, Nov. 19, 2004, Vol. 30 6, p. 1362-1364

SUMMARY OF INVENTION

Technical Problem

One of the most important in production of aligned CNT aggregates is to control, within an appropriate range, quantities of a raw material gas and a catalyst activation material to be supplied to a catalyst. In order to control the quantities, it is necessary to uniformly control, within a range suitable to production of CNTs, a concentration distribution(s) and a flow rate distribution(s) of the raw material gas and/or the catalyst activation material on a substrate. In particular, the catalyst activation material suitable to the production of the CNTs has a concentration range, and a concentration value of the concentration range is extremely small. Therefore, precise control is required.

Further, it is experimentally known that turbulence and stagnation of gas in a growth furnace influence the production of the aligned CNT aggregates. Therefore, control of a pattern of gas flow which, without being disturbed as much as possible in the growth furnace, enables quick exhaust of gas is also required.

However, in a case of a conventionally well-known apparatus for continuously producing CNTs, particularly an apparatus that continuously transfers a substrate supporting a catalyst by use of a belt-conveyor or the like (see Patent Literatures 2, and 4 through 6), it was difficult to uniformly control, within an appropriate range, the concentration distribution(s) and the flow rate distribution(s) of the raw material gas and/or the catalyst activation material on the substrate, and it was also difficult to control the pattern of the gas flow in the growth furnace. The conventionally well-known apparatus for continuously producing the CNTs ejects inert gas at an opening of the apparatus in order to prevent the outside air from flowing into the apparatus. The inert gas flown into the growth furnace may cause nonuniformity of the concentration distribution(s) and the flow rate distribution(s) of the raw material gas and/or the catalyst activation material on the substrate. Turbulence of the gas flow in the growth furnace may also be caused by the inert gas flown into the growth furnace. This made it difficult to continuously produce the aligned CNT aggregates.

The present invention was made in order to overcome such an inconvenience of the conventional technique, and a major object of the present invention is to provide an apparatus for continuously producing aligned CNT aggregates on the substrate supporting the catalyst while continuously transferring the substrate. The apparatus (i) prevents the outside air from flowing into the apparatus, (ii) uniformly controls, within the range suitable to the production of the CNTs, the concentration distribution(s) and the flow rate distribution(s) of the raw material gas and/or the catalyst activation material on the substrate and (iii) does not disturb the gas flow as much as possible in the growth furnace.

Solution to Problem

In order to attain the object, an apparatus of the present invention for producing aligned carbon nanotube aggregates is an apparatus for producing aligned carbon nanotube aggregates, the apparatus including: a growth unit including a growth furnace for growing therein the aligned carbon nanotube aggregates on a substrate supporting a catalyst on a surface of the substrate; and first gas mixing prevention means for preventing gas present outside the growth furnace from flowing into the growth furnace, the first gas mixing prevention means including: a first seal gas ejection section for ejecting a seal gas along an opening plane of at least one of (i) an opening of the growth furnace through which opening the substrate is transferred into the growth furnace and (ii) an opening of the growth furnace through which opening the substrate is transferred out of the growth furnace; and a first exhaust section for sucking and exhausting the seal gas out of the apparatus, so that the seal gas does not flow into the growth furnace through the opening of the growth furnace.

The present invention also encompasses a method for producing aligned carbon nanotube aggregates on a substrate supporting a catalyst on a surface of the substrate, the method including the following steps carried out by use of a production apparatus including: a growth unit including a growth furnace for growing therein the aligned carbon nanotube aggregates; and first gas mixing prevention means, which includes a first seal gas ejection section and a first exhaust section, for preventing gas present outside the growth furnace from flowing into the growth furnace: a gas mixing prevention step for (a) ejecting a seal gas from the first seal gas ejection section along an opening plane of at least one of (i) an opening of the growth furnace through which opening the substrate is transferred into the growth furnace and (ii) an opening of the growth furnace through which opening the substrate is transferred out of the growth furnace and (b) sucking and exhausting the seal gas out of the production apparatus from the first exhaust section, so that the seal gas does not flow into the growth furnace through the opening of the growth furnace; and a growing step for growing the aligned carbon nanotube aggregates in the growth unit.

For a fuller understanding of the nature and advantages of the invention, reference should be made to the ensuing detailed description taken in conjunction with the accompanying drawings.

Advantageous Effects of Invention

According to the present invention, an apparatus for producing aligned carbon nanotube aggregates, includes: a growth unit including a growth furnace for growing therein the aligned carbon nanotube aggregates on a substrate supporting a catalyst on a surface of the substrate; and first gas mixing prevention means for preventing gas present outside the growth furnace from flowing into the growth furnace, the first gas mixing prevention means including: a first seal gas ejection section for ejecting a seal gas along an opening plane of at least one of (i) an opening of the growth furnace through which opening the substrate is transferred into the growth furnace and (ii) an opening of the growth furnace through which opening the substrate is transferred out of the growth furnace; and a first exhaust section for sucking and exhausting the seal gas out of the apparatus, so that the seal gas does not flow into the growth furnace through the opening of the growth furnace.

According to the configuration of the apparatus, it is possible to prevent the outside air from flowing into the growth furnace, and prevent a flow of the seal gas and a flow of gas present in the growth furnace from interfering with each other. This makes it possible not only to uniformly control, within a range suitable to production of CNTs, a concentration distribution(s) and a flow rate distribution(s) of a raw material gas and/or a catalyst activation material on a substrate but also not to disturb the gas flow as much as possible in the growth furnace, thereby producing a production apparatus suitable to serial production of the aligned CNT aggregates.

DESCRIPTION OF EMBODIMENTS

Figure 1:
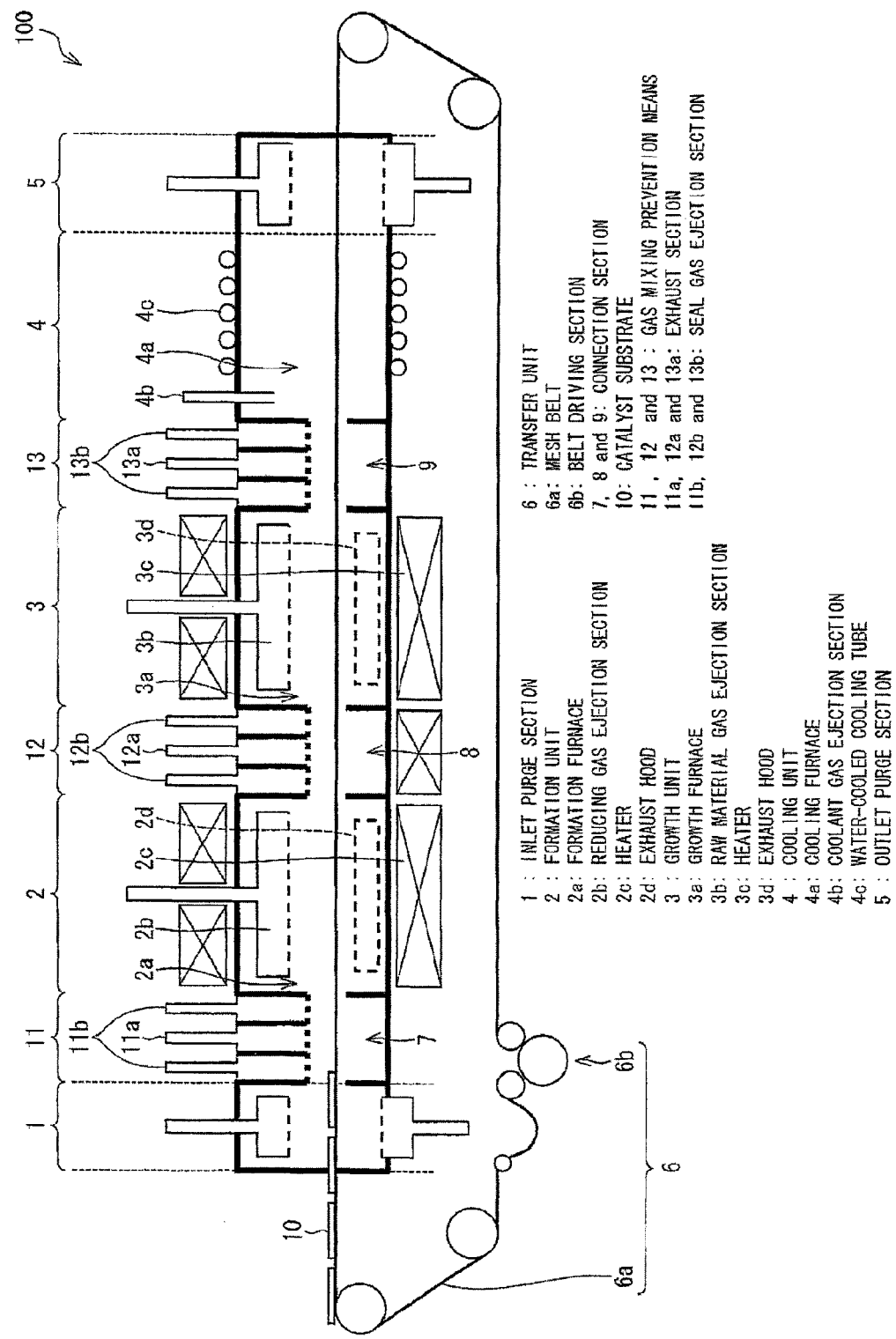
FIG. 1 is a view schematically showing a configuration of an aligned carbon nanotube aggregates producing apparatus in accordance with an embodiment of the present invention.

The following describes in detail embodiments of the present invention.

(Aligned CNT Aggregate)

An aligned carbon nanotube aggregate (hereinafter referred to also as "aligned CNT aggregate") that is produced in the present invention refers to a structure in which a large number of CNTs having grown from a substrate are aligned along a particular direction. A preferred specific surface area of the aligned CNT aggregate is not less than 600 $m^2$/g when the CNTs are mostly unopened-tubes, or is not less than 1,300 $m^2$/g when the CNTs are mostly opened-tubes. The aligned CNT aggregate having a specific surface area of not less than 600 $m^2$/g with the CNTs unopened or the aligned CNT aggregate having a specific surface area of not less than 1,300 $m^2$/g with the CNTs opened is preferable because such an aligned CNT aggregate contains less impurities such as metals or less carbon impurities (e.g., less than several tens of percent [approximately 40%] of the weight).

The aligned CNT aggregate has a weight density of not less than 0.002 $g/cm^3$ but not more than 0.2 $g/cm^3$. In a case where the weight density is not more than 0.2 $g/cm^3$, there will be a weakening in binding of the CNTs constituting the aligned CNT aggregate. Such a weakening renders the aligned CNT aggregate likely to be homogenously dispersed when stirred into a solvent or the like. That is, in the case where the weight density is not more than 0.2 $g/cm^3$, a homogenous dispersion liquid can be easily obtained. Alternatively, in a case where the weight density is not less than 0.002 $g/cm^3$, an integrity of the aligned CNT aggregate is improved, and prevented from being unbound whereby the aligned CNT aggregate is easily handled.

The aligned CNT aggregate aligned along the particular direction have a great anisotropy. What is meant by an orientation is:

1. In a case where the aligned CNT aggregate is irradiated with X rays from a first direction parallel with the longitudinal direction of the CNTs and from a second direction orthogonal to the first direction, and an x-ray diffraction intensity of the aligned CNT aggregate is measured (by θ-2θ method), a θ angle and a reflection direction where a reflection intensity from the second direction is greater than that from the first direction are obtained. Further, a θ angle and a reflection direction where the reflection intensity from the first direction is greater than that from the second direction are also obtained.

2. In a case where an X-ray diffraction intensity is measured from a two-dimensionally diffraction pattern image obtained by irradiating the aligned CNT aggregate with X rays from the direction orthogonal to the longitudinal direction of the CNTs (Laue method), a diffraction peak pattern indicating presence of anisotropy appears.

3. A Herman's orientation factor calculated on the basis of the X-ray diffraction intensity obtained by the θ-2θ method or the Laue method is more than 0 but less than 1, preferably not less than 0.25 but not more than 1.

The orientation of the aligned CNT aggregate can be evaluated by at least any one of the above methods 1 to 3. Further, according to the X-ray diffraction method, (i) diffraction intensities of a (CP) diffraction peak and a (002) peak based on packing between the single-walled CNTs, and (ii) a diffraction peak intensity in a direction of X-rays that enter parallel and perpendicular to (100) and (110) peaks based on a six-membered carbon ring constituting the single-walled CNTs are different from each other.

In order for the aligned CNT aggregate to exhibit an orientation and a large specific surface area, it is preferable that a height of the aligned CNT aggregate be in a range of not less than 10 μm but not more than 10 cm. The height of not less than 10 μm leads to an improvement in orientation. Alternatively, the height of not more than 10 cm makes it possible to improve the specific surface area, because such a height makes rapid generation possible, and adhesion of carbonaceous impurities is therefore prevented.

(Substrate)

The substrate is not limited to a specific one as long as the substrate can support a catalyst for carbon nanotubes on a surface thereof. It is preferable that the substrate can maintain its shape even at a high temperature of not lower than 400° C. Examples of materials of the substrate include: metals such as iron, nickel, chromium, molybdenum, tungsten, titanium, aluminum, manganese, cobalt, copper, silver, gold, platinum, niobium, tantalum, lead, zinc, gallium, indium, germanium, indium and antimony; alloys and oxides containing any of these metals; nonmetals such as silicon, quartz, glass, mica, graphite, and diamond; and ceramic. The metal materials are preferable because the metal materials are lower in cost than silicon and ceramic. In particular, a Fe—Cr (iron-chromium) alloy, a Fe—Ni (iron-nickel) alloy, a Fe—Cr—Ni (iron-chromium-nickel) alloy, and the like are suitable.

The substrate may take the form of a thin film, a block, or a powder, as well as a flat plate. Among these, in particular, such a form that the substrate has a large surface area for its volume is advantageous to mass production.

(Carburizing Prevention Layer)

The substrate may have a carburizing prevention layer formed on a front and/or back surface thereof. It is desirable that the substrate have a carburizing prevention layer formed on each of the front and back surfaces thereof. The carburizing prevention layer is a protecting layer for preventing the substrate from being carburized and therefore deformed in the step of generating the carbon nanotubes.

It is preferable that the carburizing prevention layer be composed of a metal or ceramic material, or especially preferably the ceramic material, which is highly effective in preventing carburizing. Examples of the metal include copper and aluminum. Examples of the ceramic material include: oxides such as aluminum oxide, silicon oxide, zirconium oxide, magnesium oxide, titanium oxide, silica alumina, chromium oxide, boron oxide, calcium oxide, and zinc oxide; and nitrides such as aluminum nitride and silicon nitride. Among them, aluminum oxide and silicon oxide are preferable because they are highly effective in preventing carburizing.

(Catalyst)

The substrate or the carburizing prevention layer has a catalyst supported thereon. Any type of catalysts that is usable for production of the CNTs can be used. Examples of the catalyst include iron, nickel, cobalt, molybdenum, a chloride thereof, an alloy thereof, and a complex or layer thereof with aluminum, alumina, titania, titanium nitride, or silicon oxide. Examples that can be given are an iron-molybdenum thin film, an alumina-iron thin film, an alumina-cobalt thin film, an alumina-iron-molybdenum thin film, an aluminum-iron thin film, and an aluminum-iron-molybdenum thin film. The catalyst can be used in a range of existential quantities that has allowed production of the CNTs. For example, in the case of use of iron, it is preferable that the thickness of a layer formed be not less than 0.1 nm but not greater than 100 nm, more preferably not less than 0.5 nm but not greater than 5 nm, or especially preferably not less than 0.8 nm but not greater than 2 nm.

It is possible to apply either a wet or dry process to the formation of the catalyst layer onto the surface of the substrate. Specifically, it is possible to apply a sputtering evaporation method or a method including applying on a substrate a liquid obtained by dispersing fine metal particles in an appropriate solvent and burning the substrate. Further, it is possible to form the catalyst into any shape with concomitant use of patterning obtained by applying well-known photolithography, nanoinprinting, or the like.

A production method employing the production apparatus of the present invention makes it possible to arbitrarily control the shape of the aligned CNT aggregate, according to the catalyst patterning formed on a substrate and the growth time for the CNTs, so that the aligned CNT aggregate takes a thin-film shape, a cylindrical shape, a prismatic shape, or any other complicated shape. In particular, in the shape of a thin film, the aligned CNT aggregate has an extremely small thickness (height) as compared with its length and width; however, the length and width can be arbitrarily controlled according to the catalyst patterning, and the thickness can be arbitrarily controlled according to the growth time for the CNTs that constitute the aligned CNT aggregate.

(Reducing Gas)

In general, a reducing gas is a gas that has at least one of the effects of reducing a catalyst, stimulating the catalyst to become fine particles suitable for the growth of the CNTs, and improving the activity of the catalyst, and that is in a gaseous state at a growth temperature. Any type of reducing gases that allow production of the CNTs can be used. A typically applicable example of the reducing gas is a gas having a reducing ability, such as hydrogen gas, ammonium, water vapor, or a mixture thereof. Alternatively, it is possible to apply a mixed gas obtained by mixing hydrogen gas with an inert gas such as helium gas, argon gas or nitrogen gas. The reducing gas is generally used in a formation step, but may be used in a growing step as appropriate.

(Raw Material Gas)

As a raw material for use in generation of the CNTs in the present invention, any raw materials that allow production of the CNTs can be used. For example, gasses having raw-material carbon sources at the growth temperature can be used. Among them, hydrocarbons such as methane, ethane, ethylene, propane, butane, pentane, hexane, heptane, and acetylene are suitable. In addition, lower alcohols such as methanol and ethanol, acetone, oxygen-containing compounds having small numbers of carbon atom such as carbon monoxide, and mixtures thereof can be used. Further, the raw material gas may be diluted with an inert gas.

(Inert Gas)

The inert gas only needs to be a gas that is inert at the temperature at which the CNTs grow, that does not deteriorate the activity of the catalyst, and that does not react with the growing CNTs. Any type of inert gases that is usable for production of the CNTs can be used. Examples that can be given are helium, argon, nitrogen, neon, krypton, and mixtures thereof. In particular, nitrogen, helium, argon, and mixtures thereof are suitable.

(Catalyst Activation Material)

It is possible to add a catalyst activation material in the CNT growing step and/or before the CNT growing step. The addition of the catalyst activation material makes it possible to further improve an efficiency in the production of the carbon nanotubes, and a purity of the carbon nanotubes. It is preferable that the catalyst activation material used here be, for example, an oxygen-containing substance that does no significant damage to the CNTs at the growth temperature. Effective examples include: water; hydrogen sulfide; oxygen; ozone; acidic gases; nitrogen oxide; oxygen-containing compounds having small numbers of carbon atom such as carbon monoxide and carbon dioxide; alcohols such as ethanol and methanol; ethers such as tetrahydrofuran; ketones such as acetone; aldehydes; esters; and mixtures thereof. Among them, water, oxygen, carbon dioxide, carbon monoxide, and ethers such as tetrahydrofuran are preferable. In particular, water is suitable.

The catalyst activation material is not particularly limited in amount to be added. However, the catalyst activation material only needs to be added in minute amounts. When the catalyst activation material is water, the catalyst activation material only needs to be added in a range of, for example, not less than 10 ppm but not greater than 10,000 ppm, preferably not less than 50 ppm but not greater than 1,000 ppm, more preferably not less than 100 ppm but not greater than 700 ppm.

The mechanism by which the catalyst activation material functions is deduced at this stage as follows: In the process of growth of the CNTs, adhesion of by-products such as amorphous carbon and graphite to the catalyst causes deactivation of the catalyst, and the growth of the CNTs is therefore inhibited. However, the presence of the catalyst activation material causes amorphous carbon, graphite and the like to be oxidized into carbon monoxide, carbon dioxide and the like, and therefore gasified. Therefore, the catalyst activation material is believed to cleanse the catalyst and express the function (catalyst activation function) of enhancing the activity of the catalyst and extending an active life of the catalyst.

With the catalyst activation material thus added, the activity of the catalyst is enhanced and the life of the catalyst is extended. When the catalyst activation material is added, the growth of the CNTs, which would continue for approximately two minutes at longest if the catalyst activation material were not added, continues for several tens of minutes, and a growth rate of the CNTs increases by a factor of 100 or more, or in some cases, even a factor of 1,000. As a result, an aligned CNT aggregate with a marked increase in height is obtained.

(Environment of High-Carbon Concentration)

An environment of high-carbon concentration means a growth atmosphere in which the proportion of the raw material gas to the total flow is approximately 2% to 20%. According to a chemical vapor deposition method that does not involve the use of a catalyst activation material, an increase in carbon concentration causes fine catalyst particles to be covered with carbonaceous impurities generated in the process of synthesis of the CNTs; therefore, the catalyst is easily deactivated, and the CNTs cannot grow efficiently. For this reason, the CNTs are synthesized in a growth atmosphere (environment of low-carbon concentration) in which the proportion of the raw material gas to the total flow is approximately 0.1% to 1%.

Since the activity of the catalyst is remarkably improved in the presence of the catalyst activation material, the catalyst is not deactivated even in an environment of high-carbon concentration. Thus, long-term growth of the CNTs is made possible, and the growth rate of the CNTs is remarkably improved. However, in the environment of high-carbon concentration, a large amount of carbon contaminants adhere to a furnace wall and the like, as compared with an environment of low-carbon concentration.

(Furnace Pressure)

It is preferable that a furnace pressure be not lower than $10^2$ Pa but not higher than $10^7$ Pa (100 atm), or more preferably not lower than $10^4$ Pa but not higher than $3 \times 10^5$ Pa (3 atm).

(Reaction Temperature)

A reaction temperature at which the CNTs grow is appropriately determined in consideration of a metal catalyst, the raw-material carbon source, and a reaction pressure. In the case of inclusion of the step of adding the catalyst activation material in order to eliminate a by-product that serves as a factor of catalyst deactivation, it is desirable that the reaction temperature be set in such a temperature range that the catalyst activation material sufficiently expresses its effect. That is, the most desirable temperature range has a lower-limit temperature at or above which the catalyst activation material can remove by-products such as amorphous carbon and graphite, and a higher-limit temperature at or below which the CNTs, which are main products, are not oxidized by the catalyst activation material.

Specifically, in the case where the catalyst activation material is water, it is preferable that the reaction temperature be not less than 400° C. but not more than 1000° C. At 400° C. or higher, the catalyst activation material favorably expresses its effect. At 1000° C. or lower, it is possible to prevent the catalyst activation material from reacting with the CNTs.

Alternatively, in the case where the catalyst activation material is carbon dioxide, it is preferable that the reaction temperature be not less than 400° C. but not more than 1100° C. At 400° C. or higher, the catalyst activation material favorably expresses its effect. At 1100° C. or lower, it is possible to prevent the catalyst activation material from reacting with the CNTs.

(Formation Step)

The formation step is a step of causing an environment surrounding the catalyst supported by the substrate to be an environment of the reducing gas and heating at least either the catalyst or the reducing gas. This step brings about at least one of the effects of reducing the catalyst, stimulating the catalyst to become fine particles suitable for the growth of the CNTs, and improving the activity of the catalyst. For example, when the catalyst is an alumina-iron thin film, the iron catalyst is reduced to become fine particles, whereby a large number of fine iron particles in nanometer size are formed on the alumina layer. Thus, the catalyst is prepared to be a catalyst suitable to production of the aligned CNT aggregate. The CNTs can be produced without the formation step. However, production amount and quality of the aligned CNT aggregate can be remarkably improved by carrying out the formation step.

(Growing Step)

The growing step is a step of growing the aligned CNT aggregate by causing the catalyst, which in the formation step has been put in a state ready for production of the aligned CNT aggregate, to be surrounded by a raw material gas environment constituted by a raw material gas, and by heating at least either the catalyst or the raw material gas.

(Cooling Step)

A cooling step is a step of, after the growing step, cooling down the aligned CNT aggregate, the catalyst and the substrate in the presence of a coolant gas. After the growing step, the aligned CNT aggregate, the catalyst and the substrate are high in temperature, and as such, may be oxidized when placed in the presence of oxygen. This is prevented by cooling down the aligned CNT aggregate, the catalyst and the substrate to, for example, not more than 400° C., or more preferably not more than 200° C. It is preferable that the coolant gas be an inert gas. In particular, in terms of safety, cost and the like, it is preferable that the coolant gas be nitrogen.

(Production Apparatus)

FIG. 1 shows an aligned CNT aggregate production apparatus in accordance with an embodiment of the present invention. A production apparatus 100 of the present embodiment basically includes an inlet purge section 1, a formation unit 2, a growth unit 3, a transfer unit 6, gas mixing prevention means 11, 12 and 13, connection sections 7, 8 and 9, a cooling unit 4, and an outlet purge section 5. The following describes how these are arranged in the production apparatus 100.

(Inlet Purge Section 1)

The inlet purge section 1 is a set of devices for preventing the outside air from flowing into a furnace of the production apparatus 100 through a substrate inlet, and has a function of replacing with a purge gas an environment surrounding a catalyst substrate 10 (a substrate supporting a catalyst on its surface) transferred into the production apparatus 100. A specific example of the inlet purge section 1 is a set of devices including a furnace or chamber in which the purge gas is retained, and a gas ejection section for ejecting the purge gas. It is preferable that the purge gas be an inert gas. In particular, in terms of safety, cost and the like, it is preferable that the purge gas be nitrogen. When an inlet through which the catalyst substrate 10 is transferred is always open as in the case where the transfer unit 6 is a belt-conveyor type, it is preferable to use, as a purge gas ejection section, a gas curtain device that ejects the purge gas from top and bottom in the form of a shower, in order to prevent the outside air from flowing in through the inlet of the production apparatus 100. It is possible to prevent the outside air from flowing into the furnace by the gas mixing prevention means 11 (later described) only. However, it is preferable that the inlet purge section 1 be included in the production apparatus 100 so that safety of the production apparatus 100 can be enhanced.

(Formation Unit 2)

The formation unit 2 is a set of devices for carrying out a formation step, and has a function of causing the catalyst formed on the surface of the catalyst substrate 10 to be surrounded by the reducing gas environment constituted by the reducing gas, and heating at least either the catalyst or the reducing gas. A specific example of the formation unit 2 is a set of devices including (i) a formation furnace 2a in which the reducing gas is retained, (ii) a reducing gas ejection section 2b for ejecting the reducing gas, (iii) an exhaust hood 2d for exhausting gas present in the formation furnace 2a, and (iv) a heater 2c for heating at least either the catalyst or the reducing gas. It is preferable that the heater be capable of heating to a temperature of not lower than 400° C. but not higher than 1100° C. Examples of the heater 2c include a resistance heater, an infrared heater, and an electromagnetic induction heater.

(Growth Unit 3)

The growth unit 3 is a set of devices for carrying out a growing step, and has a function of synthesizing the aligned CNT aggregate by causing the catalyst, which has been put into a state suitable to production of the aligned CNT aggregate in the formation step, to be surrounded by the raw material environment constituted by the raw material gas, and by heating at least either the catalyst or the raw material gas. A specific example of the growth unit 3 is a set of devices including (i) a growth furnace 3a in which the environment of the raw material gas is retained, (ii) a raw material gas ejection section 3b for ejecting the raw material gas, (iii) an exhaust hood 3d for exhausting gas present in the growth furnace 3a, and (iv) a heater 3c for heating at least either the catalyst or the raw material gas. It is preferable that the growth unit 3 include at least one raw material gas ejection section 3b and at least one exhaust hood 3d, and that the total gas flow ejected from the raw material gas ejection section 3b substantially equal or equal to that exhausted from the exhaust hood 3d. In this manner, it is possible to prevent the raw material gas from flowing out of the growth furnace 3a and also prevent gas present outside the growth furnace 3a from flowing into the growth furnace 3a. Simultaneous use of gas mixing prevention mans 12 (later described) makes it possible to control, in any forms, a concentration distribution(s) and a flow rate distribution(s) of the raw material gas and/or the catalyst activation material on the catalyst substrate 10, and a pattern of gas flow in the growth furnace 3a, on the basis of how the raw material gas ejection section 3b and the exhaust hood 3d of the growth unit 3 are designed. It is accordingly possible to produce a production apparatus suitable to serial production of the aligned CNT aggregate. The heater 3c may be any heaters that are capable of heating at a temperature of 400° C. to 1,100° C., examples of which include a resistance heater, an infrared heater, and an electromagnetic induction heater. It is preferable that the growth furnace 3a further include catalyst activation material addition means for adding the catalyst activation material.

As described above, the unit for carrying out the formation step and the unit for carrying out the growing step are separately provided in the production apparatus 100. This makes it possible to prevent carbon contaminants from adhering to an inner wall of the formation furnace 2a. This is more suitable to production of the aligned CNT aggregate.

(Transfer Unit 6)

The transfer unit 6 is a set of devices necessary for transferring the catalyst substrate 10 at least from the formation unit 2 to the growth unit 3. A specific example of the transfer unit 6 is a set of devices including a mesh belt 6a and a belt driving section 6b driven by a reducer-equipped electric motor in the case of a belt-conveyor type.

(Gas Mixing Prevention Means 11, 12 and 13)

Each of the gas mixing prevention means 11, 12 and 13 is a set of devices that performs a function of (i) preventing the outside air from flowing into a furnace of the production apparatus 100 and preventing gas present in the furnace from flowing out of the furnace or (ii) preventing gas from flowing out of one furnace (for example, the formation furnace 2a, the growth furnace 3a or a cooling furnace 4a) of the production apparatus 100 into another furnace of the production apparatus 100. The gas mixing prevention means 11, 12 and 13 are installed in the vicinity of openings of the furnaces, through which openings the catalyst substrate 10 is transferred into/out of the furnaces. Alternatively, the gas mixing prevention means 11, 12 and 13 are installed at connection sections 7, 8 and 9, via which spaces of the production apparatus 100 are connected. The gas mixing prevention means 11 includes at least one seal gas ejection section 11b that ejects seal gas along opening planes of an inlet and an outlet of a furnace of the production apparatus 100, through which inlet and outlet the catalyst substrate 10 is transferred into/out of the furnace, and at least one exhaust section 11a that sucks and exhausts, out of the production apparatus 100, mainly the seal gas thus ejected (and gas present in the vicinity of the seal gas) so that the seal gas does not flow into the furnace. The gas mixing prevention means 12 includes at least one seal gas ejection section 12b that ejects seal gas along opening planes of an inlet and an outlet of a furnace of the production apparatus 100, through which inlet and outlet the catalyst substrate 10 is transferred into/out of the furnace, and at least one exhaust section 12a that sucks and exhausts, out of the production apparatus 100, mainly the seal gas thus ejected (and gas present in the vicinity of the seal gas) so that the seal gas does not flow into the furnace. The gas mixing prevention means 13 includes at least one seal gas ejection section 13b that ejects seal gas along opening planes of an inlet and an outlet of a furnace of the production apparatus 100, through which inlet and outlet the catalyst substrate 10 is transferred into/out of the furnace, and at least one exhaust section 13a that sucks and exhausts, out of the production apparatus 100, mainly the seal gas thus ejected (and gas present in the vicinity of the seal gas) so that the seal gas does not flow into the furnace. The seal gas seals the inlet and the outlet of the furnace by being ejected along the opening planes of the furnace. This prevents gas present outside the furnace from flowing into the furnace. The seal gas is prevented from flowing into the furnace by being exhausted out of the production apparatus 100. It is preferable that the seal gas be an inert gas. In particular, in terms of safety, cost and the like, it is preferable that the seal gas be nitrogen. The seal gas ejection sections 11b, 12b and 13b, and the exhaust sections 11a, 12a and 13a can be provided such that one exhaust section is adjacent to a corresponding seal gas ejection section, alternatively one exhaust section faces a corresponding seal gas ejection section via a mesh belt. It is preferable that the seal gas ejection sections and the exhaust sections be provided such that the whole configuration of the gas mixing prevention means is symmetrical in a longitudinal direction of the furnace. As shown in FIG. 1, for example, two seal gas ejection sections are provided in both sides of one exhaust section such that the two seal gas ejection sections are provided symmetrically via the exhaust section in the longitudinal direction of the furnace. Further, it is preferable that the total gas flow ejected from the seal gas ejection sections 11b, 12b and 13b substantially equal or equal to that exhausted from the exhaust sections 11a, 12a and 13a. This makes it possible to prevent gas from flowing out of a space that sandwiches one of the gas mixing prevention means 11, 12 and 13 with another space into the another space. This also makes it possible to prevent the seal gas from flowing into the spaces. Installation of the gas mixing prevention means 12 and 13 at both edges of the growth furnace 3a makes it possible to prevent flow of the seal gas and flow of gas present in the growth furnace 3a from interfering with each other. It is accordingly possible to control, in any forms, the concentration distribution(s) and the flow rate distribution(s) of the raw material gas and/or the catalyst activation material on the catalyst substrate 10, and the pattern of the gas flow in the growth furnace 3a, on the basis of how the raw material gas ejection section 3b and the exhaust hood 3d of the growth unit 3 are designed. Further, gas flow is prevented from being disturbed due to influx of the seal gas into the growth furnace 3a. Hence, the production apparatus 100 suitable to serial production of the aligned CNT aggregate can be produced.

It is preferable that the gas mixing prevention means 11, 12 and 13 prevent gas from flowing into the furnace to such an extent that does not disturb production of the aligned CNT aggregate. In particular, in a case where the formation step is carried out, it is preferable that the gas mixing prevention means 11 and 12 prevent the raw material gas from flowing into the formation furnace 2a such that a concentration of carbon atoms in the environment of the reducing gas in the formation furnace 2a is kept preferably lower than or equal to $5 \times 10^{22}$ atoms/m$^3$, or more preferably lower than or equal to $1 \times 10^{22}$ atoms/m$^3$.

The gas mixing prevention means 12 and 13 of the present embodiment function as first gas mixing prevention means included in the production apparatus of the present invention (that is, the exhaust sections 12a and 13a function as a first exhaust section of the present invention, and the seal gas ejection sections 12b and 13b function as a first seal gas ejection section of the present invention). The gas mixing prevention means 11 and 12 of the present embodiment function as second gas mixing prevention means included in the production apparatus of the present invention (that is, the exhaust sections 11a and 12a function as a second exhaust section of the present invention, and the seal gas ejection sections 11b and 12b function as a second seal gas ejection section of the present invention). That is, the first gas mixing prevention means can be configured identically to the second gas mixing prevention means. Therefore, the gas mixing prevention means 12 functions as the first gas mixing prevention means and the second gas mixing prevention means (similarly, the exhaust section 12a functions as the first exhaust section and the second exhaust section, and the seal gas ejection section 12b functions as the first seal gas ejection section and the second seal gas ejection section).

(Catalyst Activation Material Adding Means)

Catalyst activation material adding means (not shown) is for adding the catalyst activation material, and a set of devices for, for example, either adding the catalyst activation material into the seal gas or the raw material gas, or adding the catalyst activation material directly to the environment surrounding the catalyst in the growth furnace 3a. Means for supplying the catalyst activation material is not particularly limited. Examples of the means include supplying the catalyst activation material through a bubbler, supplying the catalyst activation material by vaporizing a solution containing the catalyst activation material, supplying the catalyst activation material as it is in a gaseous state, and supplying the catalyst activation material by liquefying or vaporizing a solid catalyst activation material. It is possible to build a supply system using various apparatuses such as a vaporizer, a mixer, a stirrer, a diluter, a spray, a pump, and a compressor. The catalyst activation material adding means is included in the gas mixing prevention means 12 and/or the growth unit 3, and connected to the connection section 8 and/or the growth furnace 3a. The catalyst activation material adding means can be included only in either the gas mixing prevention means 12 or the growth unit 3. Meanwhile, in terms of further improvement in production efficiency of the aligned CNT aggregate, the catalyst activation material adding means is included preferably in at least the growth unit 3, more preferably in the gas mixing prevention means 12 and the growth unit 3. An activation effect of the catalyst can be further improved by such a configuration in which the catalyst activation material adding means is included in both the growth furnace of the production apparatus of the present invention and the first seal gas ejection section for ejecting the seal gas along the opening plane of the opening of the growth furnace through which opening the substrate is transferred into the growth furnace. An example of the catalyst activation material adding means is a set of devices including (i) a supply device for supplying the catalyst activation material to the gas mixing prevention means 12 and/or the growth unit 3, and (ii) a supply tube that connects the supply device to the gas mixing prevention means 12 and/or the growth unit 3. The supply device and the supply tube can be provided for each of the gas mixing prevention means 12 and the growth unit 3. Alternatively, the gas mixing prevention means 12 and the growth unit 3 share the supply device, and the catalyst activation material can be added to the gas mixing prevention means 12 and the growth unit 3 through a branched supply tube. Furthermore, it is possible to provide a tube or the like for the supply of the catalyst activation material with a device for measuring a concentration of the catalyst activation material. Through feedback control using values outputted from the measuring device, stable supply of the catalyst activation material with small changes over time can be ensured.

(Concentration of Carbon Atoms)

Inflow of the raw material gas into the formation furnace 2a exerts a harmful influence on the growth of the CNTs. It is preferable that the inflow of the raw material gas into the formation furnace 2a be prevented by the gas mixing prevention means 11 and 12 so that the concentration of carbon atoms in the environment of the reducing gas in the formation unit 2a is kept preferably lower than or equal to $5 \times 10^{22}$ atoms/m$^3$, or more preferably lower than or equal to $1 \times 10^{22}$ atoms/m$^3$. The "concentration of carbon atoms" here is calculated according to Eq. (1):

[Eq. (1)]

$$\text{(Concentration of Carbon Atoms)} = \sum_i C_i \frac{\rho_i D_i}{M_i} N_A \quad (1)$$

where with respect to the types of gas contained in the reducing gas (i=1, 2, . . . ), the concentration (ppmv) is denoted by $D_1, D_2, \ldots$, the density in standard condition (g/m$^3$) is denoted by $\rho_1, \rho_2, \ldots$, the molecular weight is denoted by $M_1, M_2, \ldots$, and the number of carbon atoms contained in each gas molecule is denoted by $C_1, C_2, \ldots$, and the Avogadro's number is denoted by $N_A$.

Production quantity and quality of the CNTs can be satisfactorily maintained by keeping the concentration of carbon atoms in the environment of the reducing gas in the formation furnace 2a at not higher than $5 \times 10^{22}$ atoms/m$^3$. The concentration of carbon atoms of $5 \times 10^{22}$ atoms/m$^3$ or higher causes, in the formation step, disturbance of at least one of the effects of reducing the catalyst, stimulating the catalyst to become fine particles suitable for the growth of the CNTs, and improving the activity of the catalyst, whereby, during the growing step, the production quantity of the CNTs is decreased and the quality of the CNTs is deteriorated.

(Connection Sections 7, 8 and 9)

Each of the connection sections 7, 8 and 9 is a set of devices via which respective furnace spaces of the units are spatially connected and which serve to prevent the catalyst substrate 10 from being exposed to the outside air when it is transferred from one unit to another. Examples of the connection sections 7, 8 and 9 include a furnace or chamber capable of shielding the environment surrounding the catalyst substrate 10 from the outside air and passing the catalyst substrate 10 from one unit to another.

(Cooling Unit 4)

The cooling unit 4 is a set of devices necessary for cooling down the catalyst substrate 10 on which the aligned CNT aggregate has grown. The cooling unit 4 has a function of preventing oxidation and cooling effects on the aligned CNT aggregate, the catalyst and the substrate after the growing step. A specific example of the cooling unit 4 is a set of devices including (i) a cooling furnace 4a in which a coolant gas is retained, (ii) a water-cooled cooling tube 4c disposed to surround an internal space of the cooling furnace 4a in the case of a water-cooled type, and (iii) a coolant gas ejection section 4b that ejects a coolant gas into the cooling furnace 4a in the case of an air-cooled type. Further, the water-cooled type and the air-cooled type may be used in combination.

(Outlet Purge Section 5)

The outlet purge section 5 is a set of devices for preventing the outside air from flowing into a furnace of the production apparatus through an outlet through which the catalyst substrate 10 is transferred. The outlet purge section 5 has a function of causing the environment surrounding the catalyst substrate 10 to be an environment of a purge gas. A specific example of the outlet purge section 5 is a set of devices including a furnace or chamber in which the environment of the purge gas is retained, and an ejection section for ejecting the purge gas. It is preferable that the purge gas be an inert gas. In particular, in terms of safety, cost and the like, it is preferable that the purge gas be nitrogen. When the outlet is always open as in the case where the transfer unit 6 is a belt-conveyor type, it is preferable to use, as a purge gas ejection section, a gas curtain device that ejects the purge gas from top and bottom in the form of a shower, in order to prevent the outside air from flowing in through an outlet of the production apparatus. It is possible to prevent the outside air from flowing into the furnace by the gas mixing prevention means 13 only. However, it is preferable that the outlet purge section 5 be included in the production apparatus, so that safety of the production apparatus can be enhanced.

(Reducing Gas Ejection Section, Raw Material Gas Ejection Section, and Catalyst Activation Material Ejection Section)

As the reducing gas ejection section, the raw material gas ejection section, and the catalyst activation material ejection section, shower heads each including a plurality of nozzles provided so as to face a catalyst layer formation surface of the catalyst substrate 10 may be used. What is meant by "so as to face" is that each of the nozzles is provided such that its ejection axis line forms an angle of not less than 0° but less than 90° with a line normal to the catalyst substrate 10, i.e., such that the flow direction of gas as ejected from the nozzles provided in the shower head is substantially orthogonal to the catalyst substrate 10.

Use of such a shower head as the reducing gas ejection section makes it possible to spray the reducing gas uniformly onto the catalyst substrate 10 and therefore efficiently reduce the catalyst. This makes it possible, as a result, to enhance a uniformity of the aligned CNT aggregate that grows on the catalyst substrate 10, and lower the consumption of the reducing gas.

Use of such a shower head as the raw material gas ejection section makes it possible to spray the raw material gas uniformly onto the catalyst substrate 10 and therefore efficiently consume the raw material gas. This makes it possible, as a result, to enhance the uniformity of the aligned CNT aggregate that grows on the catalyst substrate 10 and lower the consumption of the raw material gas.

Use of such a shower head as the catalyst activation material ejection section makes it possible to spray the catalyst activation material uniformly onto the catalyst substrate 10 and therefore enhance the activity of the catalyst and extend the life of the catalyst. This allows the aligned CNTs to continue to grow over a long period of time. The same is true in a case where the catalyst activation material is added to the raw material gas and a shower head is used as an ejection section for the mixture.

(Exhaust Hoods of the Formation Unit and the Growth Unit)

It is preferable that each of the exhaust hood 2d of the formation unit 2 and the exhaust unit 3d of the growth unit 3 be configured to uniformly exhaust the reducing gas, or the raw material gas and the catalyst activation material present above the catalyst substrate 10. For example, a plurality of exhaust vents are formed in both side walls of a furnace, and an exhaust hood that collects gas exhausted from the exhaust vents into a single exhaust tube is provided in both outer sides of the furnace. In this case, it is preferable that the exhaust hood be designed such that the gas exhausted from the exhaust vents flows uniformly in the longitudinal direction of the furnace. This makes it possible to uniformly and quickly exhaust gas present above the catalyst substrate 10, whereby a production apparatus suitable to serial production of the aligned CNT aggregate can be produced.

The following schematically describes a flow of whole processes carried out in the production apparatus 100.

Firstly, the catalyst substrate 10 placed on the mesh belt 6a is transferred into the furnace of the inlet purge section 1 through the inlet of the production apparatus 100. The inlet purge section 1 prevents the outside air from flowing into the furnace of the production apparatus 100 through the inlet of the production apparatus 100 by ejecting the purge gas from top and bottom in the form of a shower.

The inlet purge section 1 is spatially connected to the formation unit 2 via the connection section 7. The gas mixing prevention means 11 is provided in the connection section 7. The seal gas ejection section 11b ejects the seal gas, and the exhaust section 11a exhausts the seal gas and the gas present in the vicinity of the seal gas. This makes it possible to not only prevent the purge gas from flowing into the formation furnace 2a and prevent the reducing gas from flowing into the inlet purge section 1 but also prevent the seal gas from flowing into the inlet purge section 1 and the formation furnace 2a. The catalyst substrate 10 supporting the catalyst is subjected to the formation step in the formation furnace 2a while being transferred by the mesh belt 6a.

The formation unit 2 is spatially connected to the growth unit 3 via the connection section 8. The gas mixing prevention means 12 is provided in the connection section 8. The seal gas ejection section 12b ejects the seal gas, and the exhaust section 12a exhausts the seal gas and the gas present in the vicinity of the seal gas. This makes it possible to not only prevent the raw material gas from flowing into the formation furnace 2a and prevent the reducing gas from flowing into the growth furnace 3a but also prevent the seal gas from flowing into the formation furnace 2a and the growth furnace 3a. The catalyst substrate 10 supporting the catalyst is subjected to the growing step in the growth furnace 3a while being transferred by the mesh belt 6a, so that the aligned CNT aggregate is grown on the catalyst substrate 10.

The growth unit 3 is spatially connected to the cooling unit 4 via the connection section 9. The gas mixing prevention means 13 is provided in the connection section 9. The seal gas ejection section 13b ejects the seal gas, and the exhaust section 13a exhausts the seal gas and the gas present in the vicinity of the seal gas. This makes it possible to not only prevent the raw material gas from flowing into the cooling furnace 4a and prevent the coolant gas from flowing into the growth furnace 3a but also prevent the seal gas from flowing into the cooling furnace 4a and the growth furnace 3a. The catalyst substrate 10 on which the aligned CNT aggregate has grown is cooled down to not higher than 200° C. in the cooling furnace 4a while being transferred by the mesh belt 6a.

Lastly, the catalyst substrate 10 on which the aligned CNT aggregate has grown and which has been cooled down to not higher than 200° C. is transferred out of the production apparatus 100 while being placed on the mesh belt 6a. The outlet purge section 5 configured substantially identically to the inlet purge section 1 is provided in the outlet of the production apparatus 100. The outlet purge section 5 prevents the outside air from flowing into the cooling furnace 4a through the outlet by ejecting the purge gas from top and bottom in the form of a shower.

Figure 2:
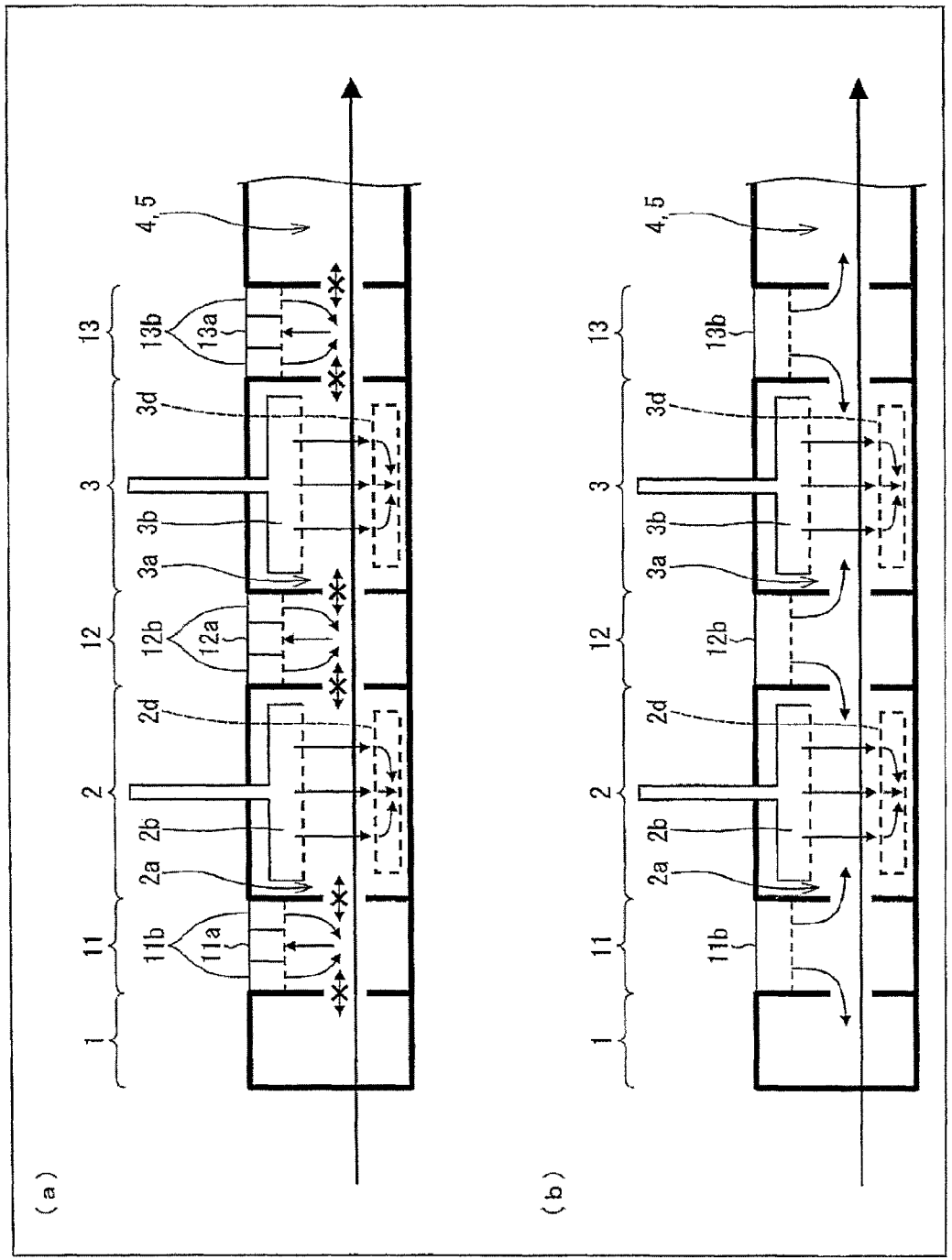
FIG. 2 is a view schematically showing a pattern of gas flow in a furnace of an aligned carbon nanotube aggregates producing apparatus in accordance with an embodiment of the present invention.

FIG. 2 is a view schematically showing a pattern of gas flow in a furnace of the production apparatus 100. FIG. 2(*a*) is a view schematically showing a pattern of gas flow in an apparatus of the present invention for producing aligned CNT aggregates. FIG. 2(*b*) is a view schematically showing, as compared to FIG. 2(*a*), a pattern of gas flow obtained in a case where the gas mixing prevention means 11, 12 and 13 have no exhaust sections 11a, 12a and 13a, respectively. In the production apparatus 100 of the present embodiment, the gas mixing prevention means 12 and 13 for ejecting the seal gas and exhausting the seal gas and the gas present in the vicinity of the seal gas are installed at both edges of the growth furnace 3a. The gas mixing prevention means 12 and 13 not only prevent gas inter-mixing between the formation furnace 2a and the growth furnace 3a, and prevent gas inter-mixing between the growth furnace 3a and the cooling furnace 4a, but also prevent the seal gas from flowing into the growth furnace 3a. The gas present in the growth furnace 3a is not disturbed by the seal gas, and controlled by the raw material gas ejection section 3b and the exhaust hood 3d of the growth unit 3. The concentration distribution(s) and the flow rate distribution(s) of the raw material gas and/or the catalyst activation material on the catalyst substrate 10 are uniformly controlled within a range suitable to the production of the CNTs, and are controlled in such a gas flow pattern that allows quick exhaust of gas used for the growth of the CNTs, by use of the shower head, serving as the raw material gas ejection section 3b, which includes the plurality of nozzles provided so as to face the catalyst layer formation surface of the catalyst substrate 10, and the exhaust hood 3d designed to uniformly exhaust the gas present in the growth furnace 3a through the plurality of exhaust vents formed in the both side walls of the growth furnace 3a. This makes it possible to produce the production apparatus suitable to serial production of the aligned CNT aggregate.

As compared to FIG. 2(*a*), FIG. 2(*b*) shows a case where the gas mixing prevention means 11, 12 and 13 prevent gas mixing by merely ejecting the seal gas. The seal gas ejected from the gas mixing prevention means 12 and 13 flows into the growth furnace 3a, and is mixed with the raw material gas ejected from the raw material gas ejection section 3b. This causes nonuniformity of the concentration distribution(s) and the flow rate distribution(s) of the raw material gas and/or the catalyst activation material on the catalyst substrate 10, and disturbance of the gas flow in the growth furnace 3a due to the seal gas flown into the growth furnace 3a, thereby making the serial production of the aligned CNT aggregate difficult.

(Materials for Components of the Production Apparatus which are Exposed to Either the Reducing Gas or the Raw Material Gas)

Components of the formation furnace 2a, the reducing gas ejection section 2b, the exhaust hood 2d of the formation unit 2, the growth furnace 3a, the raw material gas ejection section 3b, the exhaust hood 3d of the growth unit 3, the mesh belt 6a, the seal gas ejection sections 11b, 12b and 13b and the exhaust sections 11a, 12a and 13a of the gas mixing prevention means 11, 12 and 13, and furnaces of the connection sections 7, 8 and 9 of the production apparatus 100 are exposed to the reducing gas or the raw material gas. A material for those components of the production apparatus 100 is preferably heat-resistant alloys in terms of heat resistance, precision of processing, degree of flexibility of processing and cost. Examples of the heat-resistant alloys include heat-resistant steel, stainless steel, and nickel-based alloys. In general, a heat-resistant steel refers to a steel that contains Fe in major proportions and other alloys in concentrations of not greater than 50%, and a stainless steel refers to a steel that contains Fe in major proportions, other alloys in concentrations of not greater than 50%, and approximately not less than 12% of Cr. Further, examples of the nickel-based alloys include alloys obtained by adding Mo, Cr, Fe, and the like to Ni. Specifically, SUS 310, Inconel 600, Inconel 601, Inconel 625, Incoloy 800, MC Alloy, and Haynes 230 Alloy are preferable in terms of heat resistance, mechanical strength, chemical stability, low cost and the like.

Carbon contaminants that adhere to the wall surfaces and the like when the CNTs are synthesized in a high-carbon environment can be decreased by forming the inner walls of the furnaces and/or the components for use in the furnaces with a heat-resistant alloy and by either plating a surface of the heat-resistant alloy with molten aluminum or polishing the surface such that the surface has an arithmetic average roughness Ra≤2 μm. These processes are more suitable to the production of the aligned CNT aggregate.

(Molten Aluminum Plating)

Molten aluminum plating means a process of forming an aluminum or aluminum alloy layer on a surface of an object by dipping the object into a bath of molten aluminum. More specifically, the process is carried out as follows: a surface of an object (base metal) is washed (preprocessed), and then the object is dipped into a bath of molten aluminum at approximately 700° C., thereby causing the molten aluminum to disperse into the surface of the base metal so as to form an alloy of the base metal and aluminum, so that the aluminum is adhered to the alloy layer when the base metal is withdrawn from the bath. Furthermore, the molten aluminum plating also encompasses a post-dipping process in which a Fe—Al alloy layer under the surface layer (the alumina layer and aluminum surface layer) is exposed by subjecting the surface layer to low-temperature thermal diffusion.

(Polishing)

Examples of the method for polishing the heat-resistant alloy such that an arithmetic average roughness of the heat-resistant alloy is Ra≤2 μm include: mechanical polishing, which is typified by buffing; chemical polishing, which involves the use of a chemical; electrolytic polishing, which is carried out while passing an electric current through an electrolyte; and complex electrolytic polishing, which is a combination of mechanical polishing and electrolytic polishing.

(Arithmetic Average Roughness)

For a definition of arithmetic average roughness Ra, see "JIS B 0610: 2001".

The present invention is not limited to the description of the preferred embodiments above, but may be applied in many variations within the scope of gist thereof.

For example, through an appropriate setting of reaction conditions such as raw material gas and heating temperature, it is possible to selectively produce either single-walled or multiwall CNTs in the production apparatus, and it is also possible to produce both single-walled and multiwall CNTs.

Further, although in the production apparatus 100 of the present embodiment, the catalyst is formed onto the surface of the substrate by a film-forming apparatus provided separately from the production apparatus 100, the production apparatus 100 may be configured such that a catalyst layer-forming unit is provided upstream of the formation unit so that a base substrate passes through the catalyst layer-forming unit before it passes through the formation unit.

Further, although in the production apparatus 100 of the present embodiment, the formation unit 2, the growth unit 3 and the cooling unit 4 are arranged in this order and have their respective furnace spaces spatially connected via the connection sections 7, 8 and 9, a plurality of units that process steps other than the formation, growth and cooling steps may be further provided somewhere and have their respective furnace spaces spatially connected via connection sections.

Further, although in the production apparatus 100 of the present embodiment, the belt-conveyor type has been described as the transfer unit 6, the present invention is not limited to this. For example, a robot-arm type, a turntable type or a lifting-and-lowering type may be employed.

Further, although in the production apparatus 100 of the present embodiment, two types of arrangement of the formation unit 2, the growth unit 3 and the cooling unit 4, namely linear arrangement has been described, the present invention is not limited to these types. For example, these units may be arranged vertically in this order.

(Production Method of the Present Invention)

A production method of the present invention is a method for producing aligned carbon nanotube aggregates on a substrate supporting a catalyst on a surface of the substrate, the method including the following steps carried out by use of a production apparatus including: a growth unit including a growth furnace for growing therein the aligned carbon nanotube aggregates; and first gas mixing prevention means, which includes a first seal gas ejection section and a first exhaust section, for preventing gas present outside the growth furnace from flowing into the growth furnace: a gas mixing prevention step for (a) ejecting a seal gas from the first seal gas ejection section along an opening plane of at least one of (i) an opening of the growth furnace through which opening the substrate is transferred into the growth furnace and (ii) an opening of the growth furnace through which opening the substrate is transferred out of the growth furnace and (b) sucking and exhausting the seal gas out of the production apparatus from the first exhaust section, so that the seal gas does not flow into the growth furnace through the opening of the growth furnace; and a growing step for growing the aligned carbon nanotube aggregates in the growth unit.

The production method of the present invention can be suitably attained by use of, for example, the above-described production apparatus 100.

The growing step has been already described. The growing step can be suitably attained by use of, for example, the growth unit 3.

The gas mixing prevention step can be suitably attained by use of, for example, the above-described gas mixing prevention means 12 and 13. For example, the seal gas ejection sections 12b and 13b eject the seal gas along the opening plane of at least one of (i) the opening of the growth furnace 3a through which opening the catalyst substrate 10 is transferred into the growth furnace 3a and (ii) the opening of the growth furnace 3a through which opening the catalyst substrate 10 is transferred out of the growth furnace 3a, and the exhaust sections 12a and 13a suck and exhaust the seal gas out of the production apparatus 100, so that the seal gas does not flow into the growth furnace 3a.

It is preferable that the gas mixing prevention step be carried out while the growing step is being carried out. It is more preferable that the gas mixing prevention step be started to be carried out before the growing step is carried out.

It is more preferable that the production method of the present invention include the formation step. The formation step has been already described. The formation step can be suitably attained by use of the formation unit 2. The formation step is preferably carried out before the growing step.

It is more preferable that, during the growing step, the catalyst activation material be added into the growth furnace. The addition of the catalyst activation material into the growth furnace can be suitably attained by the catalyst activation material adding means included in the growth furnace 3a.

It is more preferable that, during the gas mixing prevention step, the catalyst activation material is added by the gas mixing prevention means 12.

(Additional Matter)

As described above, it is more preferable to configure the apparatus of the present invention for producing the aligned carbon nanotube aggregates such that the growth unit include a raw material gas ejection section for ejecting a raw material gas, and an exhaust hood for exhaustion of gas present in the growth furnace.

It is more preferable that the apparatus of the present invention for producing the aligned carbon nanotube aggregates further include a formation unit including a formation furnace for causing the catalyst supported by the substrate to be surrounded by a reducing gas environment constituted by a reducing gas, and at least either the catalyst or the reducing gas is heated.

It is more preferable that the apparatus of the present invention for producing the aligned carbon nanotube aggregates further include second gas mixing prevention means for preventing gas present outside the formation furnace from flowing into the formation furnace, the second gas mixing prevention means including: a second seal gas ejection section for ejecting a seal gas along an opening plane of at least one of (i) an opening of the formation furnace through which opening the substrate is transferred into the formation furnace and (ii) an opening of the formation furnace through which opening the substrate is transferred out of the formation furnace; and a second exhaust section for sucking and exhausting the seal gas out of the apparatus, so that the seal gas does not flow into the formation furnace through the opening of the formation furnace.

It is more preferable that the growth unit include catalyst activation material adding means for adding a catalyst activation material into the growth furnace.

It is more preferable that the first gas mixing prevention means include: the first seal gas ejection section for ejecting the seal gas along the opening plane of the opening of the growth furnace through which opening the substrate is transferred into the growth furnace; and the first exhaust section for sucking and exhausting the seal gas out of the apparatus, so that the seal gas does not flow into the growth furnace through the opening of the growth furnace.

It is more preferable that the first seal gas ejection section include the catalyst activation material adding means for adding the catalyst activation material.

It is more preferable that the production method of the present invention further include the following step carried out by use of a formation unit including a formation furnace in which the catalyst supported by the substrate is caused to be surrounded by a reducing gas environment constituted by a reducing gas, and at least either the catalyst or the reducing gas is heated: a formation step for causing the catalyst supported by the substrate to be surrounded by the reducing gas environment constituted by the reducing gas, and heating at least either the catalyst or the reducing gas, the formation step being carried out before the growing step.

It is more preferable that the growing step include adding a catalyst activation material into the growth furnace.

It is more preferable that during the gas mixing prevention step, the seal gas be ejected from the first seal gas ejection section along the opening plane of the opening of the growth furnace through which opening the substrate is transferred into the growth furnace, and the seal gas be sucked and exhausted out of the production apparatus, so that the seal gas does not flow into the growth furnace through the opening of the growth furnace.

It is more preferable that the first seal gas ejection section perform not only the ejecting of the seal gas but also the adding of the catalyst activation material.

EXAMPLE

Examples are given below to explain the present invention in detail. However, the present invention is not limited to these Examples. Evaluation in accordance with the present invention was carried out in the following manner.

(Measurement of Specific Surface Area)

The term "specific surface area" means a value obtained from an adsorption and desorption isotherm of liquid nitrogen at 77K using the Brunauer-Emmett-Teller equation. The specific surface area was measured by use of a BET specific surface area measuring apparatus (HM model-1210; manufactured by MOUNTECH Co., Ltd.).

(G/D Ratio)

The term "G/D ratio" means an index that is commonly used to evaluate the quality of CNTs. In a raman spectrum of CNTs as measured by a raman spectroscopic instrument, vibration modes called "G band" (near 1,600 cm$^{-1}$) and "D band" (near 1,350 cm$^{-1}$) are observed. The G band is a vibration mode based on hexagonal lattice structures of graphite appearing as cylindrical surfaces of the CNTs, and the D band is a vibration mode based on crystal defects. Therefore, with a higher peak intensity ratio of the G band to the D band (G/D ratio), the CNTs can be evaluated to be higher in quality and lower in defect rate.

In the present example, the G/D ratio was calculated by peeling off a part of an aligned CNT aggregate located near the center of a substrate and measuring a raman spectrum through irradiation with a laser of that surface of the aligned CNT aggregate which had been peeled off from the substrate, by use of a microscopic laser raman system (Nicolet Almega XR; manufactured by Thermo Fisher Scientific K.K.).

Example 1

The following describes conditions for production of a catalyst substrate. A substrate used was Fe—Ni—Cr alloy YEF 426 (Ni 42%, Cr 6%; manufactured by Hitachi Metals, Ltd.) having a size of 90 mm×90 mm with a thickness of 0.3 mm. A surface roughness of the substrate was measured by use of a laser microscope, and it was found that an arithmetic average roughness of the substrate was Ra≈2.1 μm. Alumina layers with a thickness of 20 nm were formed on both front and back surfaces of the substrate by use of a sputtering apparatus. Then, an iron layer (catalyst metal layer) with a thickness of 1.0 nm was formed only on the front surface of the substrate by use of the sputtering apparatus.

A production apparatus used in the present example is the production apparatus 100 of FIG. 1, which is described in the above embodiment. The production apparatus 100 included the inlet purge section 1, the formation unit 2, the growth unit 3, the cooling unit 4, the outlet purge section 5, the transfer unit 6, the connection sections 7 through 9, and the gas mixing prevention means 11 through 13.

Materials for the formation furnace 2a, the growth furnace 3a, the reducing gas ejection section 2b, the raw material gas ejection section 3b, the exhaust hoods 2d and 3d, the exhaust sections 11a, 12a and 13a and the seal gas ejection sections 11b, 12b and 13b of the gas mixing prevention means 11, and 13, the mesh belt 6a, and the connection sections 7, 8 and 9 were SUS310, and surfaces thereof were coated with molten aluminum.

The catalyst substrate thus produced is placed on the mesh belt 6a, and an aligned CNT aggregate is produced on the catalyst substrate 10 while a rate at which the mesh belt 6a is transferred is changed.

Conditions for the inlet purge section 1, the formation unit 2, the gas mixing prevention means 11, 12 and 13, the growth unit 3, the cooling unit 4, and the outlet purge section 5 of the production apparatus 100 were set as below.

Inlet purge section 1
Purge gas: nitrogen 60 sLm
Formation unit 2
Furnace temperature: 830° C.
Reducing gas: nitrogen 11.2 sLm, hydrogen 16.8 sLm
Exhaust quantity of the exhaust hood 2d: 28 sLm
Processing time: 28 minutes
Growth unit 3
Furnace temperature: 830° C.
Raw material gas: nitrogen 16.04 sLm, ethylene 1.8 sLm, water-vapor-containing nitrogen 0.16 sLm (moisture content 16,000 ppmv)
Exhaust quantity of the exhaust hood 3d: 18 sLm
Processing time: 11 minutes
Cooling unit 4
Cooling water temperature: 30° C.
Inert gas: nitrogen 10 sLm
Cooling time: 30 minutes
Outlet purge section 5
Purge gas: nitrogen 50 sLm
Gas mixing prevention means 11
Exhaust quantity of the exhaust section 11a: 20 sLm
Seal gas ejection section 11b: nitrogen 20 sLm
Gas mixing prevention means 12
Exhaust quantity of the exhaust section 12a: 25 sLm
Seal gas ejection section 12b: nitrogen 25 sLm
Gas mixing prevention means 13
Exhaust quantity of the exhaust section 13a: 20 sLm
Seal gas ejection section 13b: nitrogen 20 sLm Gas quantities ejected from the respective reducing gas ejection section 2b and raw material gas ejection section 3b were set to be suitable to the production of the aligned CNT aggregate by being made proportional to corresponding furnace volumes. Further, the gas mixing prevention means 12 was set to eject and exhaust the largest volume of seal gas among the gas mixing preventions means 11, 12 and 13, so that the gas is strictly prevented from inter-mixing between the formation furnace 2a and the growth unit 3a.

During the production, the reducing gas was sampled through a gas sampling port installed near the reducing gas ejection section 2b, and the constitution of the sample was analyzed by an FTIR analyzer (Nicolet 6700 FT-IR; manufactured by Thermo Fisher Scientific K.K.). As a result, it was confirmed that the concentration of ethylene in the formation furnace 2a was kept at 50 ppmv by the gas mixing prevention means 11 and 12. This concentration is translated into a concentration of carbon atoms of approximately $3\times10^{21}$ atoms/m$^3$.

The aligned CNT aggregate that was produced according to the present example had a density of 0.03 g/cm$^3$, an average external diameter of 2.9 nm (a half width of 2 nm), a carbon purity of 99.9%, a Herman's orientation factor of 0.7, a production quantity of 2.0 mg/cm$^2$, a G/D ratio of 6.3, and a BET-specific surface area of 1,100 m$^2$/g.

The above demonstrates that the production apparatus 100 of the present example can produce the aligned CNT aggregate.

Comparative Example 1

The catalyst substrate 10 and the production apparatus 100 identical to those of Example 1 were used to produce the aligned CNT aggregate. In Comparative Example 1, conditions for the inlet purge section 1, the formation unit 2, the gas mixing prevention means 11, 12 and 13, the growth unit 3, the cooling unit 4, and the outlet purge section 5 were set as follows.

Inlet purge section 1
Purge gas: nitrogen 60 sLm
Formation unit 2
Furnace temperature: 830° C.
Reducing gas: nitrogen 11.2 sLm, hydrogen 16.8 sLm
Exhaust quantity of the exhaust hood 2d: 28 sLm
Processing time: 28 minutes
Growth unit 3
Furnace temperature: 830° C.
Raw material gas: nitrogen 16.04 sLm, ethylene 1.8 sLm, water-vapor-containing nitrogen 0.16 sLm (moisture content 16,000 ppmv)
Exhaust quantity of the exhaust hood 3d: 18 sLm
Processing time: 11 minutes
Cooling unit 4
Cooling water temperature: 30° C.
Inert gas: nitrogen 10 sLm
Cooling time: 30 minutes
Outlet purge section 5
Purge gas: nitrogen 50 sLm
Gas mixing prevention means 11
Exhaust quantity of the exhaust section 11a: 0 sLm
Seal gas ejection section 11b: nitrogen 20 sLm
Gas mixing prevention means 12
Exhaust quantity of the exhaust section 12a: 0 sLm
Seal gas ejection section 12b: nitrogen 25 sLm
Gas mixing prevention means 13
Exhaust quantity of the exhaust section 13a: 0 sLm
Seal gas ejection section 13b: nitrogen 20 sLm The production apparatus 100 was set to zero in terms of gas quantity exhausted from the gas mixing prevention means 11, 12 and 13, thereby, in a pseudo manner, being equivalent to an apparatus in which the gas mixing prevention means includes no exhaust section.

Consequently, the surface of the catalyst substrate became black, and CNTs have just slightly grown on the catalyst substrate. This demonstrates that the production apparatus of the present invention has its predominance over the production apparatus of Comparative Example 1 in the production of the aligned CNT aggregate.

Example 2

The production apparatus 100 and the catalyst substrate 10 identical to those of Example 1 other than provision of the catalyst activation material adding means in the seal gas ejection section 12b were used to produce the aligned CNT aggregate. In Example 2, conditions for the inlet purge section 1, the formation unit 2, the gas mixing prevention means 11, 12 and 13, the growth unit 3, the cooling unit 4, and the outlet purge section 5 were set as follows.

Inlet purge section 1
Purge gas: nitrogen 60 sLm
Formation unit 2

Furnace temperature: 830° C.
Reducing gas: nitrogen 11.2 sLm, hydrogen 16.8 sLm
Exhaust quantity of the exhaust hood $2d$: 28 sLm
Processing time: 28 minutes
Growth unit 3
Furnace temperature: 830° C.
Raw material gas: nitrogen 16.04 sLm, ethylene 1.8 sLm, water-vapor-containing nitrogen 0.16 sLm (moisture content 16,000 ppmv)
Exhaust quantity of the exhaust hood $3d$: 18 sLm
Processing time: 11 minutes
Cooling unit 4
Cooling water temperature: 30° C.
Inert gas: nitrogen 10 sLm
Cooling time: 30 minutes
Outlet purge section 5
Purge gas: nitrogen 50 sLm
Gas mixing prevention means 11
Exhaust quantity of the exhaust section $11a$: 20 sLm
Seal gas ejection section $11b$: nitrogen 20 sLm
Gas mixing prevention means 12
Exhaust quantity of the exhaust section $12a$: 28.2 sLm
Seal gas ejection section $12b$: nitrogen 25 sLm, water-vapor-containing nitrogen 3.2 sLm (moisture content 16,000 ppmv)
Gas mixing prevention means 13
Exhaust quantity of the exhaust section $13a$: 20 sLm
Seal gas ejection section $13b$: nitrogen 20 sLm During the production, the reducing gas was sampled through a gas sampling port installed near the reducing gas ejection section $2b$, and the constitution of the sample was analyzed by an FTIR analyzer (Nicolet 6700 FT-IR; manufactured by Thermo Fisher Scientific K.K.). As a result, it was confirmed that the concentration of ethylene in the formation furnace $2a$ was kept at 50 ppmv by the gas mixing prevention means 11 and 12. This concentration is translated into a concentration of carbon atoms of approximately $3 \times 10^{21}$ atoms/m³.

The aligned CNT aggregate that was produced according to the present example had a density of 0.03 g/cm³, an average external diameter of 2.9 nm (a half width of 2 nm), a carbon purity of 99.9%, a Herman's orientation factor of 0.7, a production quantity of 2.8 mg/cm², a G/D ratio of 6.3, and a BET-specific surface area of 1,100 m²/g.

This demonstrates that the aligned CNT aggregate is produced 1.4 times as much as that of Example 1 by addition of water as a catalyst activation material into the seal gas of the gas mixing prevention means 12.

INDUSTRIAL APPLICABILITY

The present invention can produce aligned CNT aggregates with an excellent production efficiency, thereby being suitably applicable to fields of electronic device materials, optical element materials, conducting materials and like materials.

REFERENCE SIGNS LIST

2: formation unit
$2a$: formation furnace
$2d$: exhaust hood
3: growth unit
$3a$: growth furnace
$3d$: exhaust hood
11: gas mixing prevention means (second gas mixing prevention means)
12: gas mixing prevention means (first gas mixing prevention means, second gas mixing prevention means)
13: gas mixing prevention means (first gas mixing prevention means)
$11a$: exhaust section (second exhaust section)
$12a$: exhaust section (first exhaust section, second exhaust section)
$13a$: exhaust section (first exhaust section)
$11b$: seal gas ejection section (second seal gas ejection section)
$12b$: seal gas ejection section (first seal gas ejection section, second seal gas ejection section)
$13b$: seal gas ejection section (first seal gas ejection section)
100: production apparatus (apparatus for producing aligned carbon nanotube aggregates)

The invention claimed is:

1. A method for producing aligned carbon nanotube aggregates on a substrate supporting a catalyst on a surface of the substrate,
the method comprising the following steps carried out by use of a production apparatus including:
a growth unit including a growth furnace, and
a first seal, the first seal including at least one seal gas ejection section and at least one exhaust section, the method comprising:
growing in the growth furnace of the growth unit the aligned carbon nanotube aggregates;
ejecting a seal gas from the at least one seal gas ejection section along an opening plane of at least one of
(i) an inlet or an outlet of the growth furnace, and
(ii) both the inlet and the outlet of the growth furnace, and
exhausting, via the at least one exhaust section, the seal gas thus ejected so that the seal gas does not flow into the growth furnace.

2. The method as set forth in claim 1 for producing the aligned carbon nanotube aggregates, further comprising the following step carried out by use of a formation unit including a formation furnace in which the catalyst supported by the substrate is caused to be surrounded by a reducing gas environment constituted by a reducing gas, and at least either the catalyst or the reducing gas is heated:
a formation step for causing the catalyst supported by the substrate to be surrounded by the reducing gas environment constituted by the reducing gas, and heating at least either the catalyst or the reducing gas, the formation step being carried out before the growing step.

3. The method as set forth in claim 1 for producing the aligned carbon nanotube aggregates, wherein:
the growing step includes adding a catalyst activation material into the growth furnace.

4. The method as set forth in claim 3 for producing the aligned carbon nanotube aggregates, wherein:
the seal gas is ejected from the at least one seal gas ejection section along the opening plane of the inlet of the growth furnace, and
the seal gas is exhausted out of the production apparatus, so that the seal gas does not flow into the growth furnace through the inlet of the growth furnace.

5. The method as set forth in claim 4 for producing the aligned carbon nanotube aggregates, wherein:
the at least one seal gas ejection section performs not only the ejecting of the seal gas but also the adding of the catalyst activation material.

6. The method as set forth in claim 1 for producing the aligned carbon nanotube aggregates, the method further comprising:

moving, via a transfer unit, the substrate supporting a catalyst through the production apparatus, the transfer unit extending through openings in opposite sides of the production apparatus.

7. The method as set forth in claim 1 for producing the aligned carbon nanotube aggregates, the method further comprising:
ejecting a raw material gas via a raw material gas ejection section included in the growth unit, and
exhausting gas present in the growth furnace via an exhaust hood.

8. The method as set forth in claim 2 for producing the aligned carbon nanotube aggregates, the method further comprising:
ejecting, via at least one seal gas ejection section included in a second seal, seal gas along an opening plane of:
   (i) an inlet or an outlet of the formation furnace or
   (ii) both the inlet and the outlet of the formation furnace; and
exhausting, via at least one exhaust section included in the second seal, the seal gas thus ejected so that the seal gas does not flow into the formation furnace.

\* \* \* \* \*